United States Patent
Brunel et al.

(10) Patent No.: US 9,190,552 B2
(45) Date of Patent: Nov. 17, 2015

(54) METHOD AND DEVICE FOR ADJUSTING THE BIAS VOLTAGE OF A SPAD PHOTODIODE

(71) Applicant: STMicroelectronics (Grenoble 2) SAS, Grenoble (FR)

(72) Inventors: John Brunel, Grenoble (FR); Cedric Tubert, Sassenage (FR)

(73) Assignee: STMicroelectronics (Grenoble 2) SAS, Grenoble (FR)

( * ) Notice: Subject to any disclaimer, the term of this patent is extended or adjusted under 35 U.S.C. 154(b) by 334 days.

(21) Appl. No.: 13/896,219

(22) Filed: May 16, 2013

(65) Prior Publication Data

US 2013/0334411 A1    Dec. 19, 2013

(30) Foreign Application Priority Data

Jun. 13, 2012 (FR) ...................................... 12 01690

(51) Int. Cl.
  *G01J 1/44* (2006.01)
  *H01L 31/107* (2006.01)
  *H01L 31/02* (2006.01)

(52) U.S. Cl.
  CPC ................. *H01L 31/107* (2013.01); *G01J 1/44* (2013.01); *H01L 31/02016* (2013.01); *H01L 31/02019* (2013.01); *H01L 31/02027* (2013.01); *G01J 2001/4466* (2013.01)

(58) Field of Classification Search
  CPC ........................... G01J 1/44; G01J 2001/4466
  See application file for complete search history.

(56) References Cited

U.S. PATENT DOCUMENTS

| 4,706,018 | A | * | 11/1987 | Beha et al. | ................ | 324/754.23 |
| 5,929,982 | A | * | 7/1999 | Anderson | .................... | 356/73.1 |
| 6,222,660 | B1 | | 4/2001 | Traa | | |
| 2011/0270543 | A1 | * | 11/2011 | Schmidt et al. | .................. | 702/58 |

FOREIGN PATENT DOCUMENTS

| WO | 03/069379 A2 | 8/2003 |
| WO | 2008/085968 A1 | 7/2008 |
| WO | 2008/121072 A1 | 10/2008 |

* cited by examiner

*Primary Examiner* — David Porta
*Assistant Examiner* — Hugh H Maupin
(74) *Attorney, Agent, or Firm* — Seed IP Law Group PLLC

(57) ABSTRACT

The present disclosure relates to a method for adjusting a bias voltage of a SPAD photodiode, comprising successive steps of: applying to the photodiode a first test bias voltage lower than a normal bias voltage applied to the photodiode in a normal operating mode, subjecting the photodiode to photons, reading a first avalanche triggering signal of the photodiode, applying to the photodiode a second test bias voltage, different from the first test bias voltage, subjecting the photodiode to photons, reading a second avalanche triggering signal of the photodiode, increasing the normal bias voltage if the first and second signals indicate that the photodiode did not avalanche trigger, and reducing the normal bias voltage if the first and second signals indicate that the photodiode did avalanche trigger.

18 Claims, 2 Drawing Sheets

METHOD AND DEVICE FOR ADJUSTING THE BIAS VOLTAGE OF A SPAD PHOTODIODE

BACKGROUND

1. Technical Field

The present disclosure relates to photodetectors, and in particular to single-photon avalanche photodiodes (SPAD).

2. Description of the Related Art

Photodetectors capable of detecting a single photon are used in many applications such as detecting an object and measuring distances, analyzing DNA or proteins, time-resolved spectroscopy such as fluorescence correlation spectroscopy and fluorescence life-time imaging, as well as inspecting VLSI high-density integrated circuits. Distance measurement can be carried out based on a propagation time of a beam of photons emitted in the form of pulses and reflected on the object.

One well-known method involves using photodiodes as detection and distance measurement elements, by using an avalanche phenomenon which may occur in the pn junction of photodiodes. An avalanche phenomenon can be triggered in a diode pn junction when the diode is reverse-biased in the vicinity of the breakdown voltage of the junction. This phenomenon can be used in two ways in an avalanche photodiode. If the avalanche photodiode is reverse-biased just below the breakdown voltage, the photodiode then generates an electric current proportional to the intensity of the flow of photons received by the photodiode, with a gain of a few hundred with a semiconductor such as silicon.

To detect low-intensity flows of photons, one well-known method involves using photodiodes which can be reverse-biased above the breakdown voltage. Such photodiodes are referred to as SPAD photodiodes or Single-Photon Avalanche Diodes or diodes operating in "Geiger" mode. Every time such a photodiode receives a photon, an avalanche phenomenon occurs in the pn junction of the photodiode, thus generating a relatively intense current. To prevent the photodiode from being destroyed by this intense current, the photodiode is connected to a quenching circuit enabling the avalanche process to be stopped a few nanoseconds after it occurred.

To perform a distance measurement, one well-known method involves lighting a detection zone with a pulsed light source such as a pulsed laser source, and detecting photons reflected by an object present in the detection zone using a detector comprising several SPAD photodiodes, for example disposed according to a matrix configuration. The distance of the object present in the detection zone is assessed on the basis of the propagation time or time of flight (TOF) between the instant a light pulse is emitted and the instant a pulse appears at the terminals of a photodiode, resulting from the avalanche triggering of the photodiode. The measurement accuracy depends particularly on the duration of the light pulses emitted by the source, and the shorter these pulses are, the more accurate the measurement can be.

In a CMOS-type integrated circuit, powered by a voltage in the order of 3 to 5V, the reverse bias of the SPAD photodiodes at a voltage higher than the breakdown voltage, requires a bias voltage of about 14V. Such a voltage is produced by a high voltage generating circuit, for example using a charge pump enabling the supply voltage to be increased.

It transpires that the breakdown voltage of a SPAD photodiode can vary greatly from one photodiode to another depending on the manufacturing conditions of the photodiodes. The breakdown voltage may also vary greatly over time particularly depending on the ambient temperature.

Now, knowledge of this breakdown voltage is important to determine a minimum bias voltage enabling a SPAD photodiode to be put in condition for detecting a photon. Furthermore, the bias voltage of SPAD photodiodes must not be too high to avoid generating an excessively high so-called "dark current". In addition, the higher this bias voltage is, the more leakage currents there will be in the circuits, and the more difficult the design of these circuits is.

In certain applications, it can also be desirable to place one or more SPAD photodiodes of a detector in a state in which they will not avalanche trigger under the effect of a photon. Now, cutting off a high voltage such as the bias voltage of SPAD photodiodes requires relatively large transistors that, on the other hand, have a relatively slow switch speed. If the detector comprises a large number of SPAD photodiodes that must be selectively biased, it is hardly conceivable to associate such a transistor with each SPAD photodiode. However, the bias voltage applied to each SPAD photodiode can be lowered below the breakdown voltage using small and fast transistors. However, this solution requires the breakdown voltage of each SPAD photodiode of the detector to be accurately known.

FIG. 1 represents a characteristic curve of current according to the bias voltage of a SPAD photodiode. The part of this characteristic curve corresponding to a negative bias voltage (reverse bias), comprises two parts C1, C2, respectively before and after the breakdown voltage Vbd of the SPAD photodiode. In the part C1 between 0V and the voltage Vbd, a reverse current substantially constant at a low value passes through the photodiode. In the part C2, beyond the voltage Vbd, the reverse current increases rapidly. FIG. 1 also represents a portion of curve C3 extending from the value of the current at the voltage Vbd to the negative currents and corresponding to the leakage currents in the SPAD photodiode. FIG. 1 also represents the bias voltage Vhv of the SPAD photodiode, the difference between the voltage Vhv and the breakdown voltage Vbd is noted Veb. The difference between the voltage Vhv and a voltage lower than the voltage Vbd, to ensure that the SPAD photodiode cannot avalanche trigger, is noted Vsd. The application of the voltage difference Vsd to the bias voltage Vhv prevents the SPAD photodiode from avalanche triggering.

BRIEF SUMMARY

To limit the leakage currents and the dark current, it is desirable for the voltage Vhv to be as low as possible. For a fast switch between active and inactive states of a SPAD photodiode, it is desirable for the voltage difference Vsd to be as low as possible. As a result, it is desirable to monitor with sufficient precision the breakdown voltage Vbd of a SPAD photodiode to adjust the bias voltage Vhv of the photodiode. It is also desirable to be capable of performing such an adjustment sufficiently often to monitor any variations in the voltage Vbd.

Some embodiments relate to a method for adjusting a bias voltage of a SPAD single-photon avalanche photodiode, comprising successive steps of: applying to a photodiode a first test bias voltage lower than a normal bias voltage applied to the photodiode in a normal operating mode, subjecting the photodiode to photons, reading a first avalanche triggering signal of the photodiode, applying to the photodiode a second test bias voltage, different from the first test bias voltage, subjecting the photodiode to photons, reading a second avalanche triggering signal of the photodiode, increasing the normal bias voltage if the first and second signals indicate that the photodiode did not avalanche trigger, and reducing the normal bias voltage if the first and second signals indicate that the photodiode did avalanche trigger.

According to one embodiment, several SPAD photodiodes receive the normal bias voltage and the first and second test bias voltages, and supply avalanche triggering signals, the normal bias voltage being increased if the numbers of photodiodes subjected to the first and second bias voltages, that avalanche triggered, are below a threshold value, and reduced if these numbers are higher than or equal to the threshold value.

According to one embodiment, the threshold value is set to 1.

According to one embodiment, the method comprises a step of selecting in a set of SPAD photodiodes one or more photodiodes due to receive the first and second test bias voltages.

According to one embodiment, photodiodes are selected by applying to the selected photodiodes the first and second test bias voltages and to the non-selected photodiodes, the first and second bias voltages reduced by a deactivation voltage.

According to one embodiment, the first and second test bias voltages are chosen between the normal bias voltage and the normal bias voltage reduced by the deactivation voltage.

According to one embodiment, the deactivation voltage is set to a value lower than the difference between minimum and maximum breakdown voltages of the photodiodes of the set of photodiodes, such that at the normal bias voltage, the number of inactive photodiodes of the set of photodiodes remains below a threshold value.

According to one embodiment, the normal bias voltage is adjusted in constant steps.

According to one embodiment, the normal bias voltage is adjusted periodically or when a temperature difference since a previous adjustment of the normal bias voltage is higher than a temperature threshold value.

According to one embodiment, the deactivation voltage is set to a minimum value to minimize the size of transistors enabling the deactivation voltage to be generated and applied to the photodiodes to be deactivated.

Some embodiments also relate to a measuring device comprising a SPAD photodiode and a bias circuit supplying the photodiode with a normal bias voltage in a normal operating mode of the device, the measuring device comprising a calibration circuit configured to implement the method defined above.

According to one embodiment, the device comprises a set of SPAD photodiodes biased by the bias circuit, and a measuring circuit configured to develop a measurement signal according to avalanche triggering signals coming from the photodiodes of the set of photodiodes.

According to one embodiment, each photodiode comprises a cathode receiving the normal bias voltage or a test bias voltage and an anode receiving a non-zero deactivation voltage if the photodiode is to be deactivated, and linked to the ground through a resistor.

BRIEF DESCRIPTION OF THE SEVERAL VIEWS OF THE DRAWINGS

Some examples of embodiments of the present disclosure will be described below in relation with, but not limited to, the following figures, in which.

DETAILED DESCRIPTION

Figure 1:
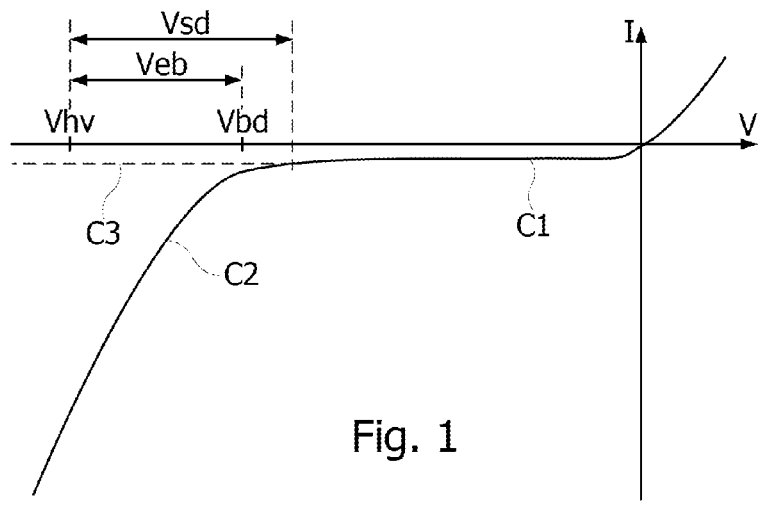
FIG. 1 described above represents a characteristic curve of a current passing through a SPAD photodiode according to the bias voltage of the photodiode.
Figure 2:
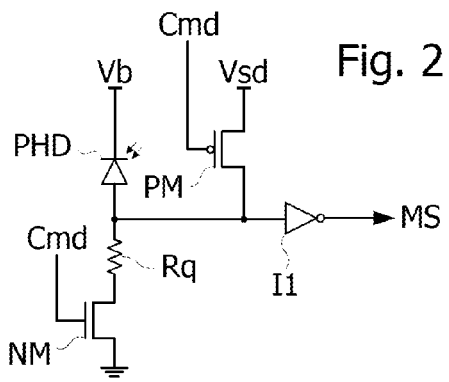
FIG. 2 represents a SPAD photodiode and a bias and control circuit for biasing and controlling the photodiode, according to one embodiment, FIG. 3 schematically represents a device for adjusting the bias voltage of SPAD photodiodes, according to one embodiment.

FIG. 2 represents a SPAD photodiode and a bias and control circuit for biasing and controlling the photodiode. In FIG. 2, the photodiode PHD comprises a cathode receiving a bias voltage Vb, and an anode linked to the ground through a quenching resistor Rq. The anode of the photodiode PHD is also linked to a measuring circuit, for example through an inverter I1 supplying a triggering signal MS. The voltage Vb is a high voltage, for example equal to the voltage Vhv in FIG. 1, higher (in absolute value) than the breakdown voltage Vbd of the photodiode PHD.

According to one embodiment, the photodiode PHD can be deactivated thanks to the supply of a voltage Vsd on its anode. The voltage Vsd can be supplied through a MOS transistor, referenced PM, for example of P-channel type, comprising a gate terminal receiving a command signal Cmd. The voltage Vsd is such that Vb−Vsd is lower than the breakdown voltage Vbd of the photodiode PHD, and is thus insufficient for the photodiode to be capable of avalanche triggering upon receiving a photon. Another N-channel MOS transistor referenced NM can be interposed between the resistor Rq and the ground. The transistor NM comprises a gate terminal controlled by the signal Cmd. Therefore, when the signal Cmd is in the low state, the transistor PM is on and the transistor NM is off. The photodiode PHD is thus biased at the voltage Vb−Vsd (<Vbd) and thus deactivated. When the signal Cmd is in the high state, the transistor PM is off and the transistor NM is on. The photodiode PHD is then biased at the voltage Vb (>Vbd) and thus active.

Figure 3:
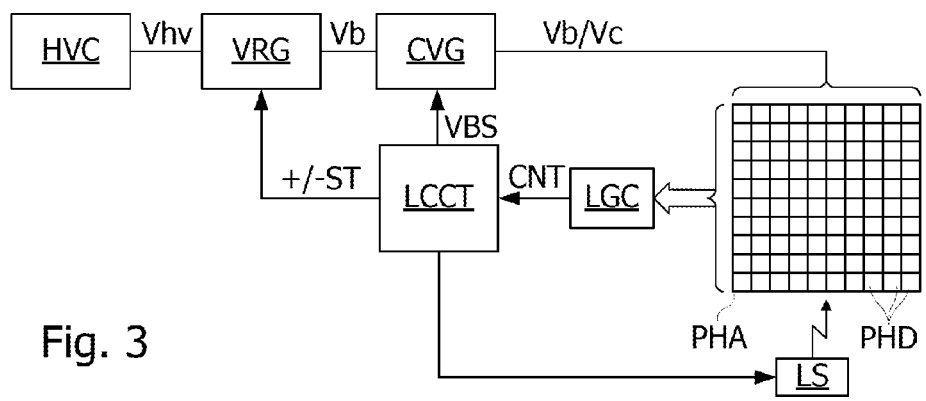

FIG. 3 represents a device for powering an array PHA of SPAD photodiodes, referenced PHD. Such an array is for example used in a detection or distance measuring device. Each photodiode PHD is associated with a control circuit such as the one represented in FIG. 2. The photodiodes PHD are biased by a high bias voltage Vb produced by a voltage regulation circuit VRG receiving a high voltage Vhv supplied by a high voltage generating circuit HVC. The circuit HVC comprises for example a charge pump to produce the high voltage Vhv in the order of 14V, from the supply voltage of the circuit, in the order of 2 to 5V.

According to one embodiment, the power supply circuit comprises a calibration circuit, comprising a calibration voltage generating circuit CVG, a control circuit LCCT, a logic counting circuit LGC and a photon emission circuit LS coupled to the array PHA. The calibration voltage generating circuit CVG receives the bias voltage Vb. During calibration phases, the calibration voltage generating circuit CVG produces, using the voltage Vb, upon a selection command VBS from the control circuit LCCT a test voltage Vc that is supplied as bias voltage to one or more of the photodiodes PHD of the array PHA. Outside calibration phases, the calibration voltage generating circuit CVG supplies the array PHA with the bias voltage Vb received from the voltage regulation circuit VRG. The photon emission circuit LS is configured to send upon command from the control circuit LCCT photons likely to be captured at least by the photodiode(s) PHD receiving the voltage Vc as bias voltage. The control circuit LCCT also orders the voltage regulation circuit VRG to adapt the bias voltage Vb according to a result of a calibration measurement. The logic counting circuit LGC is configured to receive from each photodiode PHD of the array PHA the triggering signal MS indicating whether or not the photodiode avalanche triggered, and to determine a measurement signal CNT according to the triggering signals MS received from the photodiodes.

According to one embodiment, the logic counting circuit LGC is configured so that the state of the measurement signal CNT depends on the result of a comparison with a threshold of the number of photodiodes PHD of the array PHA supplying a triggering signal in the high state. As an example, this threshold can be set for example to 10, 20, 50 or 60% of the total number of photodiodes in the array PHA, according to the applications of the device in FIG. 3.

According to another embodiment, the logic counting circuit LGC is a simple logic gate of OR type, such that the measurement signal CNT is in the high state (=1) if at least one photodiode PHD avalanche triggered, i.e., if at least one photodiode supplies a triggering signal in the high state. The measurement signal CNT is in the low state (0) if no (active) photodiode PHD of the array PHA avalanche triggered.

Figure 4:
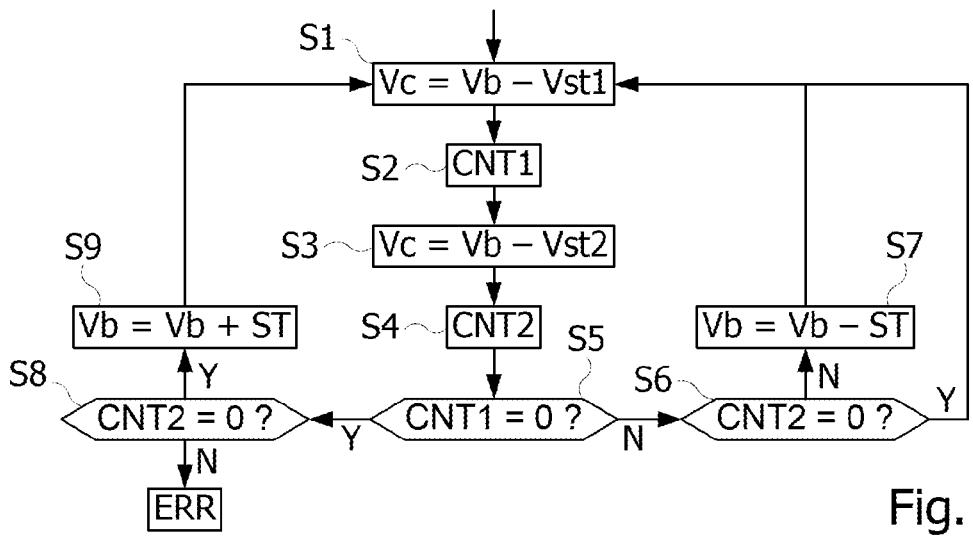
FIG. 4 represents a sequence of steps of adjusting the bias voltage of a photodiode, according to one embodiment.

FIG. 4 represents a sequence of steps S1 to S9 performed during a calibration procedure executed by the control circuit LCCT. This procedure assess the breakdown voltage Vbd of one or more photodiodes PHD of the array in relation to two test voltages Vb1 and Vb2 derived from the bias voltage Vb supplied by the voltage regulation circuit VRG. If the breakdown voltage Vbd of the photodiodes considered is lower than the two voltages Vb1 and Vb2, the voltage Vb is considered too high and is thus reduced by one step ST. If the breakdown voltage Vbd is higher than the two voltages Vb1 and Vb2, the voltage Vb is considered too low and is thus increased by the step ST. If the breakdown voltage Vbd is between the two voltages Vb1 and Vb2, the voltage Vb is considered to have a correct value and is thus not changed. The command signal VBS sent by the logic control circuit LCCT to the calibration voltage generating circuit CVG enables a bias voltage to be selected from the three voltages Vb, Vb1 and Vb2.

The control circuit LCCT first of all executes the steps S1 to S5 successively. In the step S1, the control circuit LCCT orders the calibration voltage generating circuit CVG to generate a test voltage Vc equal to the voltage Vb1 corresponding to the bias voltage Vb reduced by a first voltage Vst1 (Vb1=Vb−Vst1). The test voltage Vc is applied as a reverse bias voltage to one or more selected photodiodes PHD or all the photodiodes of the array PHA. In the step S2, the control circuit LCCT triggers a measurement by the photodiodes biased by the voltage Vc, by ordering the photon emission circuit LS to send a photon pulse. In response, the control circuit LCCT receives a first measurement signal CNT1 coming from the photodiodes biased by the voltage Vc. In the step S3, the control circuit LCCT again orders the calibration voltage generating circuit CVG to generate a test voltage Vc equal to the voltage Vb2 corresponding to the bias voltage Vb reduced by a second voltage Vst2 (Vb2=Vb−Vst2), the voltage Vst2 being higher than the voltage Vst1. The voltage Vc is applied as a reverse bias voltage to the selected photodiodes PHD of the array PHA. In the step S4, the control circuit LCCT triggers a second measurement by the photodiodes biased by the voltage Vc, by ordering the photon emission circuit LS to send a photon pulse. In response, the control circuit LCCT receives a second measurement signal CNT2 coming from the photodiodes biased by the voltage Vc. In the step S5, the control circuit LCCT compares the first measurement signal CNT1 with 0. If the first measurement signal CNT1 is zero, the control circuit LCCT executes step S6, otherwise it executes step S8. In the steps S6 and S8, the control circuit LCCT compares the second measurement signal CNT2 with 0. If the second measurement signal CNT2 is zero in the step S6, this means that the breakdown voltage Vbd of the photodiodes having supplied the signals CNT1 and CNT2, is between the test voltages Vb2 and Vb1, and thus that the bias voltage Vb is correct. The calibration sequence is then complete. If, in the step S6, the second measurement signal CNT2 is non zero, this means that the breakdown voltage Vbd of the photodiodes having supplied the first and second measurement signals CNT1 and CNT2, is higher than the two voltages Vb1 and Vb2, and thus that the bias voltage Vb is too high. The control circuit LCCT then executes step S7 during which it orders the voltage regulation circuit VRG to reduce the bias voltage Vb by one step ST, for example in the order of 100 mV. The calibration sequence is then complete.

If the second measurement signal CNT2 is zero in the step S8, this means that the breakdown voltage Vbd of the photodiodes having supplied the first and second measurement signals CNT1 and CNT2, is higher than the test voltages Vb1 and Vb2, and thus that the bias voltage Vb is too low. The control circuit LCCT then executes step S9 during which it orders the voltage regulation circuit VRG to increase the bias voltage Vb by the step ST. The calibration sequence is then complete. If the second measurement signal CNT2 is non zero in the step S8, this means that the breakdown voltage Vbd of the photodiodes having supplied the first and second measurement signals CNT1 and CNT2, is higher than the test voltage Vb1 and lower than the test voltage Vb2, which is impossible as Vb1>Vb2. The calibration procedure is then completed by sending an error signal. The calibration procedure in FIG. 4 could thus be simplified by removing step S8 that is only used to detect an improbable error.

Figure 5:
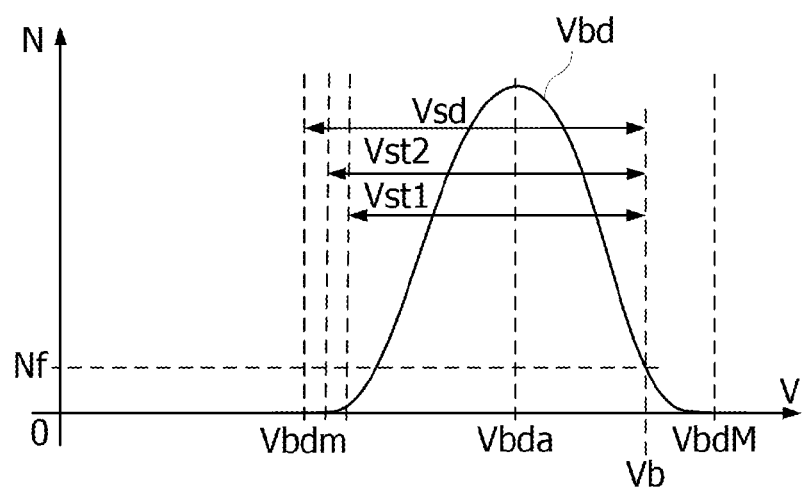
FIG. 5 represents a distribution curve of breakdown voltages of photodiodes coming from a manufacturing line, according to a number of SPAD photodiodes.

FIG. 5 represents a distribution curve of breakdown voltages Vbd of SPAD photodiodes coming from a manufacturing line, according to a number of SPAD photodiodes. This curve has the form of a Gauss curve centered on a mean breakdown voltage value Vbda, and located between minimum Vbdm and maximum values VbdM. Therefore, all the SPAD photodiodes considered have a breakdown voltage Vbd that is between the values Vbdm and VbdM.

The sequence of steps in FIG. 4 aims to adjust the bias voltage Vb to a value such that at the bias voltage Vb−Vsd, the array PHA supplies a zero measurement signal CNT. The voltage Vb−Vsd is thus lower than or equal to the voltage Vbdm. At the bias voltage Vb, a number Nf of photodiodes of the array PHA remains inactive.

According to one embodiment, the voltage Vsd is set to a minimum value to minimize the size of the transistors enabling this voltage to be generated and applied to the photodiodes to be deactivated. The voltage Vsd can thus be set to a value slightly lower than the difference between the voltages VbdM and Vbdm, so that at the bias voltage Vb, the number Nf of inactive photodiodes remains below a threshold value, set for example to 10% of the photodiodes of the array PHA.

According to one embodiment, the voltages Vst1 and Vst2 are chosen lower than Vsd so that Vst2−Vst1=K.ST, K being a coefficient higher than 2 and ST being the adjustment step of the bias voltage Vb used in the steps S7 and S9, and Vst2>Vst1. The voltage Vst2 can be set to Vsd−K'.ST, K' being a coefficient higher than 2. The step ST can be set to a fraction of the voltage Vsd, for example between $1/10^{th}$ and $1/20^{th}$ of the voltage Vsd, for example $1/12^{th}$ of the voltage Vsd. The choice of the step value ST results from a compromise between the accuracy of the adjustment of the voltage Vb and the execution time of the calibration procedure.

For example, the voltage Vhv from which the voltage Vb is adjusted, is set to 14V, the deactivation voltage Vsd is set to 1.2V, and the step ST is set to $1/12^{th}$ of the voltage Vsd. The voltage Vst2 can then be set to 800 mV (K' chosen equal to 4 if ST=100 mV) and the voltage Vst1 can be set to 600 mV (K chosen equal to 4 with ST=100 mV).

The calibration procedure executed by the control circuit LCCT can be executed once during a start-up procedure of the measuring device into which the array PHA is integrated. Indeed, it may be assumed for example that the ambient temperature varies little during a phase of using the measuring device between starting and stopping the latter. This procedure can also be executed in a periodic manner, particularly to monitor variations in temperature during the use of the measuring device, or when a temperature difference since a previous execution of the calibration procedure, higher than a threshold value, is detected by a temperature sensor connected to the control circuit LCCT.

The calibration procedure can be executed simultaneously with several photodiodes or with all photodiodes of the array PHA. The photodiodes not chosen for the execution of the calibration procedure are deactivated using the command signal Cmd (FIG. 2) enabling them to be biased to the voltage Vb−Vsd.

It will be understood by those skilled in the art that various alternative embodiments and various applications of the present disclosure are possible. In particular, although the description above presented a method for adjusting a voltage applied to an array of SPAD photodiodes, this method can be further applied to a measuring device comprising only one SPAD photodiode. Furthermore, the photodiodes of the measuring device are not necessarily spread according to a matrix configuration, but can be disposed according to any other configuration.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A method, comprising:
adjusting a bias voltage of a first single-photon avalanche photodiode (SPAD), the adjusting including:
applying to the first photodiode a first test bias voltage lower than a normal bias voltage applied to the first photodiode in a normal operating mode;
subjecting the first photodiode to photons;
reading a first avalanche triggering signal of the first photodiode;
applying to the first photodiode a second test bias voltage, different from the first test bias voltage;
subjecting the first photodiode to photons;
reading a second avalanche triggering signal of the first photodiode;
determining if the first photodiode triggered avalanche by analyzing the first and second triggering signals;
increasing the normal bias voltage if the first photodiode did not trigger avalanche; and
reducing the normal bias voltage if the first photodiode did trigger avalanche in response to both the first and second test bias voltages.

2. A method according to claim 1, further comprising:
applying the normal bias voltage to a plurality of second SPAD photodiode while applying the normal bias voltage to the first SPAD photodiode;
applying the first and second test bias voltages to the plurality of second photodiodes while applying the first and second test bias voltages to the first photodiode;
receiving a first set of the first avalanche triggering signals from the first photodiode and the plurality of second photodiodes;
receiving a second set of the second avalanche triggering signals from the first photodiode and the plurality of second photodiodes;
determining a number of the first photodiode and the plurality of second photodiodes that triggered avalanche by analyzing the first and second set of first and second triggering signals;
increasing the normal bias voltage if the number of photodiodes that triggered avalanche is below a threshold value; and
reducing the normal bias voltage if the number of photodiodes is greater than or equal to the threshold value.

3. A method according to claim 2 wherein the threshold value is 1.

4. A method according to claim 2, further comprising selecting a set of the plurality of second SPAD photodiodes to receive the first and second test bias voltages.

5. A method according to claim 4 wherein selecting the set of the plurality of second photodiodes includes applying the first and second test bias voltages to the set of the plurality of second photodiodes and applying the first and second bias voltages reduced by a deactivation voltage to remaining ones of the plurality of second photodiodes.

6. A method according to claim 5 wherein the first and second test bias voltages are between the normal bias voltage and the normal bias voltage reduced by the deactivation voltage.

7. A method according to claim 5 wherein the deactivation voltage is a value lower than a difference between minimum and maximum breakdown voltages of the photodiodes of the set of the plurality of second photodiodes, such that at the normal bias voltage, the number of inactive photodiodes of the set of photodiodes remains below the threshold value.

8. A method according to claim 1 wherein the normal bias voltage is adjusted by constant steps.

9. A method according to claim 1, further comprising adjusting the normal bias voltage periodically.

10. A method according to claim 1, further comprising adjusting the normal bias voltage after detecting a temperature difference if a previous adjustment of the normal bias voltage is higher than a temperature threshold value.

11. A method according to claim 5, further comprising setting the deactivation voltage to a minimum value to minimize a size of transistors enabling the deactivation voltage to be generated and applied to the photodiodes to be deactivated.

12. A measuring device, comprising:
a first SPAD photodiode; and
a bias circuit configured to supply the first photodiode with a normal bias voltage in a normal operating mode of the device, the bias circuit including:
a calibration circuit configured to:

apply to the first photodiode a first test bias voltage lower than the normal bias voltage;
subject the first photodiode to photons;
read a first avalanche triggering signal of the first photodiode;
apply to the first photodiode a second test bias voltage, different from the first test bias voltage;
subject the first photodiode to photons;
read a second avalanche triggering signal of the first photodiode;
analyze the first and second triggering signals to determine if the first photodiode triggered avalanche;
increase the normal bias voltage if the first photodiode did not trigger avalanche; and
reduce the normal bias voltage if the first photodiode did trigger avalanche in response to both the first and second test bias voltages.

13. A device according to claim 12, further comprising:
a set of second SPAD photodiodes configured to be biased by the bias circuit; and
a measuring circuit configured to develop a measurement signal according to avalanche triggering signals coming from ones of the photodiodes of the set of second photodiodes.

14. A device according to claim 12 wherein each photodiode comprises a cathode configured to receive the normal bias voltage or a test bias voltage and an anode configured to receive a non-zero deactivation voltage if the photodiode is to be deactivated, and linked to the ground through a resistor.

15. A device, comprising:
a bias circuit configured to provide a normal bias voltage to a first photodiode, the bias circuit including:
a calibration circuit configured to:
apply to the first photodiode a first test bias voltage lower than the normal bias voltage;
subject the first photodiode to photons;
read a first avalanche triggering signal of the first photodiode;
apply to the first photodiode a second test bias voltage, different from the first test bias voltage;
subject the first photodiode to photons;
read a second avalanche triggering signal of the first photodiode;
analyze the first and second triggering signals to determine if the first photodiode triggered avalanche;
increase the normal bias voltage if the first photodiode did not trigger avalanche; and
reduce the normal bias voltage if the first photodiode did trigger avalanche in response to both the first and second test bias voltages.

16. The device of claim 15, further comprising a measuring circuit configured to develop a measurement signal according to avalanche triggering signals coming from ones of a set of second photodiodes.

17. A device, comprising:
a control circuit configured to generate a selection signal;
a calibration voltage circuit coupled to the control circuit and configured to receive the selection signal, during a calibration phase the calibration voltage circuit is configured to generate a test voltage from a bias voltage;
a photon emission circuit coupled to the control circuit configured to emit photons during the calibration phase;
a voltage generation circuit configured to generate the bias voltage;
an array of photodiodes configured to receive the test voltage and the photons; and
a logic counting circuit coupled to the array of photodiodes and configured to generate a measurement signal in response to the photons during the calibration phase, the control circuit being configured to receive the measurement signal and to transmit an adjustment signal to the voltage generation circuit to adjust the bias voltage in response to the measurement signal.

18. The device of claim 17 wherein the control circuit is configured to:
apply to the test voltage to the photodiodes, the test voltage being lower than the bias voltage;
subject the photodiodes to photons from the photon emission circuit;
read a first avalanche triggering signal from the photodiodes;
adjust the test voltage to have a value different from the test voltage previously applied;
apply the adjusted test voltage to the photodiodes;
subject the photodiodes to photons from the photon emission circuit;
read a second avalanche triggering signal from the photodiodes;
analyze the first and second triggering signals to determine if the photodiodes triggered avalanche;
increase the bias voltage if the photodiodes did not trigger avalanche; and
reduce the bias voltage if the photodiodes did trigger avalanche.

* * * * *